United States Patent
Weber

(10) Patent No.: US 9,203,356 B2
(45) Date of Patent: Dec. 1, 2015

(54) OVERLOAD PROTECTION FOR AMPLIFIER OF PHOTODIODE SIGNAL

(71) Applicant: PRIMESENSE LTD., Tel Aviv (IL)

(72) Inventor: Raviv Weber, Herzliya (IL)

(73) Assignee: APPLE INC., Cupertino, CA (US)

( * ) Notice: Subject to any disclaimer, the term of this patent is extended or adjusted under 35 U.S.C. 154(b) by 233 days.

(21) Appl. No.: 14/058,247

(22) Filed: Oct. 20, 2013

(65) Prior Publication Data

US 2014/0110566 A1     Apr. 24, 2014

Related U.S. Application Data

(60) Provisional application No. 61/716,552, filed on Oct. 21, 2012.

(51) Int. Cl.
  *H03F 3/08*    (2006.01)
  *H03F 1/52*    (2006.01)

(52) U.S. Cl.
  CPC .. *H03F 1/52* (2013.01); *H03F 3/08* (2013.01); *H03F 3/087* (2013.01)

(58) Field of Classification Search
  CPC ......................................................... H03F 3/08
  USPC ............ 250/214 R, 214 A; 398/202; 375/316
  See application file for complete search history.

(56) References Cited

U.S. PATENT DOCUMENTS 6,643,472 B1 *  11/2003  Sakamoto et al. ............. 398/202
2011/0233385 A1 *  9/2011  Dyer ......................... 250/214 R

FOREIGN PATENT DOCUMENTS

WO        2010020278 A1     2/2010

* cited by examiner

*Primary Examiner* — Renee D Chavez
(74) *Attorney, Agent, or Firm* — D. Kligler I.P. Services Ltd.

(57) ABSTRACT

A method for sensing includes connecting an input of a trans-impedance amplifier (TIA) to a first terminal of a sensor, which generates a current in response to an input signal that is incident on the sensor, the signal comprising pulses of a characteristic duration. A resistor is connected in series between a second terminal of the sensor and a power supply, which is set to drive the sensor at a selected voltage. A capacitor is connected to the second terminal in parallel with the sensor and the TIA and in series with the resistor. An upper limit is set on the current that is to be input to the TIA from the sensor, and respective values of the resistor and the capacitor are chosen, responsively to the characteristic duration of the pulses and the selected voltage, to prevent the current input to the TIA from exceeding the upper limit.

4 Claims, 1 Drawing Sheet

OVERLOAD PROTECTION FOR AMPLIFIER OF PHOTODIODE SIGNAL

CROSS-REFERENCE TO RELATED APPLICATIONS

This application claims the benefit of U.S. Provisional Patent Application 61/716,552, filed Oct. 21, 2012, which is incorporated herein by reference.

FIELD OF THE INVENTION

The present invention relates generally to devices and circuits for light detection, and particularly to avalanche photodiodes.

BACKGROUND

An avalanche photodiode (APD) is a sensitive type of optical sensor, which converts optical radiation into electric current, which is proportional to the optical power. The APD is connected on one side to a high-voltage supply and on the other side to a load. Conversion of the optical radiation into current by the APD uses energy from the DC high-voltage supply. The DC supply provides enough energy for the APD to generate pulses of high current, wherein the maximum current can reach 10 A. Such overcurrent may occur, for example, if the APD is exposed to a bright light, and may damage the APD or the load.

The problem of excessive APD current is known in the art. For example, PCT International Publication WO 2010/020278, whose disclosure is incorporated herein by reference, describes an APD circuit, comprising an APD, typically connected in parallel to a capacitor, with a current shunt circuit. The current shunt circuit activates to shunt current from the APD in response to detecting a decrease in the impedance of the APD, which is typically measured by determining the slope of the voltage across the APD. By using this circuit, the APD is said to be protected from sudden increases in incident light level decreasing the impedance of the APD to an extent that the energy such as is stored in the capacitor can damage the structure of the APD.

SUMMARY

Embodiments of the present invention that are described hereinbelow provide circuits and methods that can be used to protect an amplifier of signals output by a high-gain sensor, such as an APD.

There is therefore provided, in accordance with an embodiment of the present invention, a method for sensing, which includes connecting an input of a trans-impedance amplifier (TIA) to a first terminal of a sensor, which generates a current in response to an input signal that is incident on the sensor, the signal including pulses of a characteristic duration. A resistor is connected in series between a second terminal of the sensor and a power supply, which is set to drive the sensor at a selected voltage. A capacitor is connected to the second terminal in parallel with the sensor and the TIA and in series with the resistor. An upper limit is set on the current that is to be input to the TIA from the sensor. Respective values of the resistor and the capacitor are chosen, responsively to the characteristic duration of the pulses and the selected voltage, so that the capacitor provides sufficient energy to enable the TIA to generate a pulsed output signal in response to the pulses of the input signal, while preventing the current input to the TIA from exceeding the upper limit.

Typically, choosing the values includes identifying a desired voltage level and pulse duration of the pulsed output signal, and selecting a value of capacitance so that the energy stored in the capacitor is sufficient to provide the desired voltage level and pulse duration but is not sufficient to allow the current input to the TIA to reach the upper limit. In one embodiment, the sensor has a capacitance between 0.1 and 2 pF, and the selected voltage of the power supply is between 20 and 220 volts DC, and the respective values are chosen so that the resistor has a resistance between 1 and 500 kΩ, and the capacitance of the capacitor is between 0.1 and 2 pF.

In a disclosed embodiment, the sensor includes an avalanche photodiode, which is configured to generate the current in response to optical radiation that is incident on the sensor.

There is also provided, in accordance with an embodiment of the present invention, a sensing device, which includes a sensor, having first and second terminals, and a trans-impedance amplifier (TIA), which has an input connected to the first terminal of the sensor, and which is configured to generate a current in response to an input signal that is incident on the sensor, the signal including pulses of a characteristic duration. A power supply is set to drive the sensor at a selected voltage. A resistor is connected in series between the second terminal of the sensor and the power supply, and a capacitor is connected to the second terminal in parallel with the sensor and the TIA and in series with the resistor. Respective values of the resistor and the capacitor are chosen, responsively to the characteristic duration of the pulses and the selected voltage, so that the capacitor provides sufficient energy to enable the TIA to generate a pulsed output signal in response to the pulses of the input signal, while preventing the current input to the TIA from exceeding a predefined upper limit on the current that is to be input to the TIA from the sensor.

The present invention will be more fully understood from the following detailed description of the embodiments thereof, taken together with the drawings in which:

DETAILED DESCRIPTION OF EMBODIMENTS

In some optical sensing applications, a trans-impedance amplifier (TIA) is connected as the load of an APD. The TIA converts the output current of the APD into a voltage signal. The maximum input current for saturation of a typical TIA, however, is about 1 mA, and 10 mA can cause permanent damage. Addition of a series resistor between the APD and the DC power supply that drives the APD will limit the maximum APD current, but it can also limit the real signal that is output by the TIA.

In some applications, the optical input signals to be detected by the APD are narrow pulses, which may have a pulse duration of no more than several nanoseconds. Stronger optical signals of longer duration will reach the APD only in cases of error or system fault. Therefore, in the embodiments that are described hereinbelow, a parallel capacitor is added between the APD high voltage point and ground. The capacitor can be charged with energy proportional to its capacitance $E=\frac{1}{2}CV^2$. The values of the series resistor and the parallel capacitor are chosen so as to give the correct output current from the APD for the narrow signal pulses, so that the TIA outputs a pulsed voltage signal that accurately reflects the input optical signal, while limiting higher currents that may arise due to faults so that they do not exceed a predefined upper limit. This approach has the advantages of simplicity and energy efficiency, while effectively protecting the circuit components.

Figure 1:
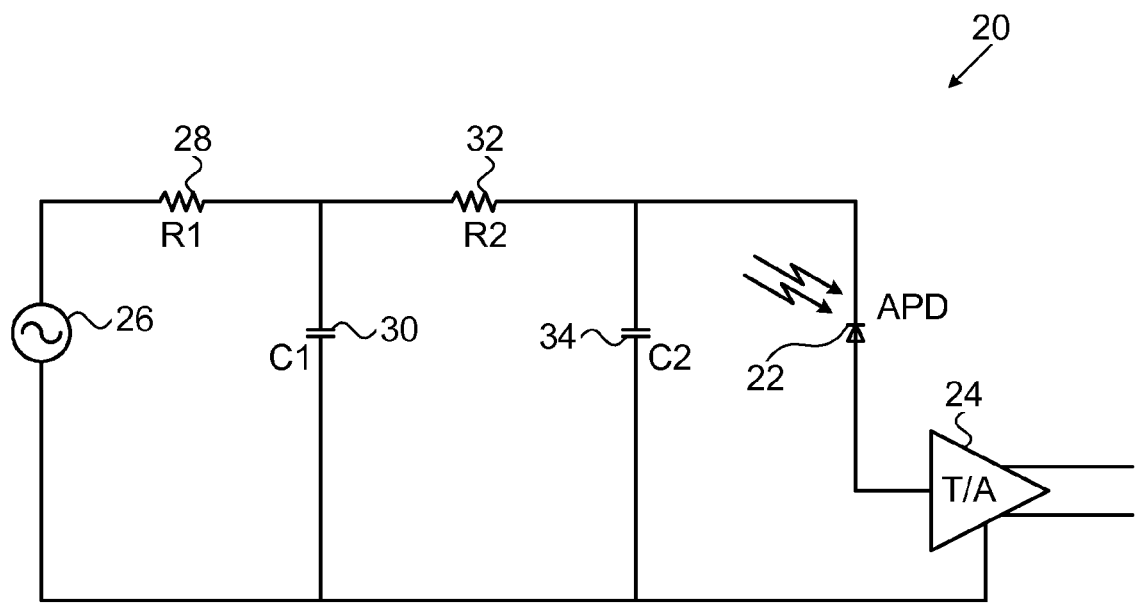
FIG. 1 is a schematic circuit diagram illustrating a sensing device, in accordance with an embodiment of the present invention.

FIG. 1 is a schematic circuit diagram illustrating a sensing device 20, in accordance with an embodiment of the present invention. Device 20 comprises an APD 22, connected at one of its terminals to the input of a TIA 24. As noted earlier, APD 22 generates a current in response to an input signal that is incident on the sensor. In the present example, the input signal comprises optical pulses of a certain characteristic duration, for example, several nanoseconds, and the current pulses output by the APD are converted by TIA 24 to a pulsed output voltage signal.

As in conventional designs of APD-based sensing devices, the second terminal of APD 22 is connected to a DC power supply 26 via a low-pass filter, comprising a resistor 28 (R1) and a capacitor 30 (C1), which filters out power supply noise. Capacitor 30 is chosen with a sufficiently large value to provide the desired filtering, but as such also stores a substantial amount of energy. If capacitor 30 were to be discharged directly through APD 22 as the result of a fault, the resulting current could exceed the upper limit of TIA 24 and cause damage to the TIA and/or APD.

To prevent this sort of damage, a protection resistor 32 (R2) is connected in series between the second terminal of APD 22 and power supply 26, and an additional capacitor 34 (C2) is connected to this terminal in parallel with APD 22 and TIA 24 and in series with resistor 32. As explained earlier, the values of resistor 32 and capacitor 34 are chosen, depending on the characteristic duration of the optical pulses sensed by the APD and the voltage level of power supply 26, so that capacitor 34 provides sufficient energy to enable the TIA to generate a pulsed output signal that faithfully reflects the optical pulses of the input signal, while preventing the current input to the TIA from exceeding a predefined upper limit.

Figure 2:
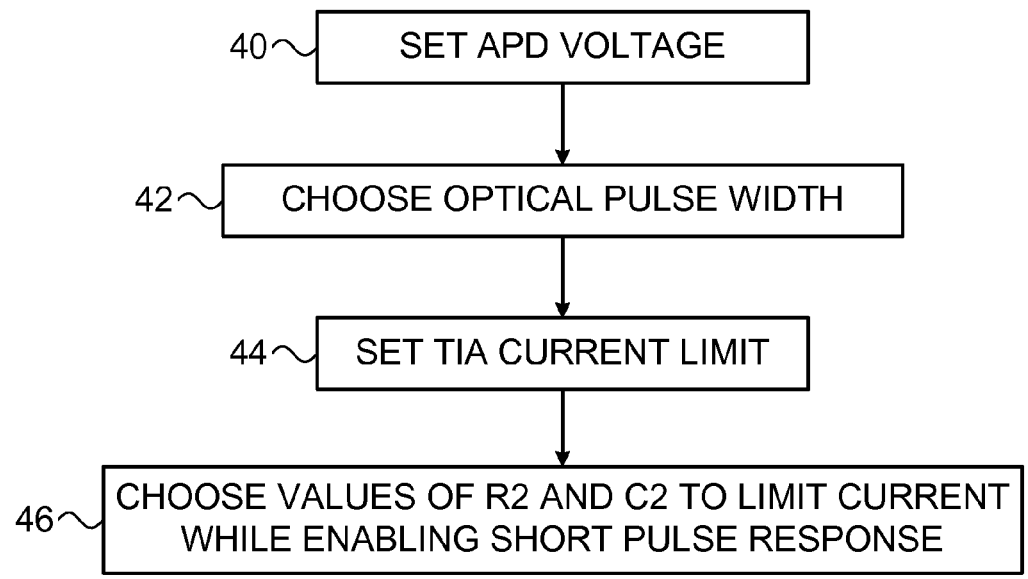
FIG. 2 is a flow chart that schematically illustrates a method for selecting values of components to be used in a sensing device, in accordance with an embodiment of the present invention.

FIG. 2 is a flow chart that schematically illustrates a method for selecting values of components to be used in a sensing device, in accordance with an embodiment of the present invention. The method is described here, for the sake of clarity and specificity, with reference to the elements of device 20, but it may similarly be applied in other sorts of devices that contain an APD or other type of high-gain sensor.

The choice of the values R2 and C2 depends on other circuit parameters: The voltage to be supplied to APD 22 by power supply 26 is set, at a supply setting step 40. Typically, the voltage V is in the range of 20-220 volts DC, depending on the characteristics of the APD and the desired gain. The width of the optical pulses, $t_{PULSE}$, to be detected by APD 22 is determined, at a pulse definition step 42. The pulse repetition time, $t_{REP}$, may also be determined at this stage, as it has an impact on the value of R2. For example, device 20 may be used to detect pulses received in a laser ranging (depth mapping) system, with a characteristic pulse width output by the laser in the range 0.1-5 ns and a repetition time of 10-500 ns, depending on the system maximal range and the required range resolution. The upper current limit for input from APD 22 to TIA 24 is selected depending on the TIA characteristics, at a limit sensing step 44. This limit should be less than the damage threshold of the TIA, for example, 10 mA.

The values of R2 and C2 are then chosen, as noted above, so that capacitor 34 provides sufficient energy to enable TIA 24 to generate a pulsed output signal in response to the short pulses of the input signal, while preventing the current input to the TIA from exceeding the upper limit, at a value setting step 46. Specifically, depending on the desired voltage level and pulse duration of the pulsed output signal from TIA 24, the value C2 is set so that the energy stored in capacitor 34 is sufficient to provide the desired voltage level and pulse duration but is not sufficient to allow the current input to the TIA to reach the upper limit. The value R2 of resistor 32 is similarly set, depending on the voltage level, to limit the DC current to less than the upper limit of the TIA.

The appropriate capacitance value C2 may be determined by noting that the energy stored in capacitor will be $E=\frac{1}{2}C2*V^2$, while the current discharged through TIA 24 will be $I=C(dV/dt)$, wherein C represents the combined capacitance of capacitor 34 and APD 22. Assuming the APD capacitance to be in the range of 0.1-2 pF, and the voltage V of supply 26 to be in the range of 20-220 volts DC, with optical pulses in the nanosecond range, as noted above, the criteria of step 46 may be met by setting R2 to be between 1 and 500 kΩ, and C2 between 0.1 and 2 pF.

The criteria for selection of the values of R2 and C2 may also be stated in terms of the pulse timing parameters defined above, $t_{PULSE}$ and $t_{REP}$, along with the current limit $I_{MAX}$ of TIA 24 and the voltage drop ΔV across the TIA at the current limit. To adequately protect TIA 24, capacitor 34 should have a value no greater than $C2=I_{MAX}*t_{PULSE}/\Delta V$. Resistor 32 is set to $R2=t_{REP}/(2\alpha*C2)$, wherein α is a constant that is typically set to be in the range between 0.75 and 1.25, and determines the level of recharging of capacitor 34 between pulses.

Although the embodiments described above refer specifically to optical pulse detection using an APD, the principles of the present invention are similarly applicable to protection of amplifiers used with other types of high-gain sensors. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for sensing, comprising:
connecting an input of a trans-impedance amplifier (TIA) to a first terminal of a sensor, which has a capacitance between 0.1 and 2 pF and which generates a current in response to an input signal that is incident on the sensor, the signal comprising pulses of a characteristic duration;
connecting a resistor, having a resistance between 1 and 500 kΩ, in series between a second terminal of the sensor and a power supply, which is set to drive the sensor at a selected voltage between 20 and 220 volts DC;
connecting a capacitor, having a capacitance between 0.1 and 2 pF, to the second terminal in parallel with the sensor and the TIA and in series with the resistor;
setting an upper limit on the current that is to be input to the TIA from the sensor; and
choosing respective values of the resistor and the capacitor, responsively to the characteristic duration of the pulses and the selected voltage, so that the capacitor provides sufficient energy to enable the TIA to generate a pulsed output signal in response to the pulses of the input signal, while preventing the current input to the TIA from exceeding the upper limit, wherein choosing the values comprises identifying a desired voltage level and pulse duration of the pulsed output signal, and selecting the capacitor so that the energy stored in the capacitor is sufficient to provide the desired voltage level and pulse duration but is not sufficient to allow the current input to the TIA to reach the upper limit.

2. The method according to claim 1, wherein the sensor comprises an avalanche photodiode, which is configured to generate the current in response to optical radiation that is incident on the sensor.

3. A sensing device, comprising:

a sensor, having first and second terminals;

a trans-impedance amplifier (TIA), which has an input connected to the first terminal of the sensor, which has a capacitance between 0.1 and 2 pF, and which is configured to generate a current in response to an input signal that is incident on the sensor, the signal comprising pulses of a characteristic duration;

a power supply, which is set to drive the sensor at a selected voltage between 20 and 220 volts DC;

a resistor, having a resistance between 1 and 500 kΩ, connected in series between the second terminal of the sensor and the power supply; and a capacitor, having a capacitance between 0.1 and 2 pF, connected to the second terminal in parallel with the sensor and the TIA and in series with the resistor, wherein respective values of the resistor and the capacitor are chosen, responsively to the characteristic duration of the pulses and the selected voltage, so that the capacitor provides sufficient energy to enable the TIA to generate a pulsed output signal in response to the pulses of the input signal, while preventing the current input to the TIA from exceeding a predefined upper limit on the current that is to be input to the TIA from the sensor, wherein the capacitor has a capacitance that is selected so that the energy stored in the capacitor is sufficient to provide a specified voltage level and pulse duration in the pulsed output signal but is not sufficient to allow the current input to the TIA to reach the upper limit.

4. The device according to claim 3, wherein the sensor comprises an avalanche photodiode, which is configured to generate the current in response to optical radiation that is incident on the sensor.

* * * * *